United States Patent [19]

Hahn

[11] 4,428,018
[45] Jan. 24, 1984

[54] LOW LEAKAGE FILTERED POWER SUPPLY

[75] Inventor: Steven Hahn, East Hampton, N.Y.

[73] Assignee: High Stoy Technological Corporation, Lake Success, N.Y.

[21] Appl. No.: 337,112

[22] Filed: Jan. 5, 1982

[51] Int. Cl.$^3$ .............................................. H02H 9/08
[52] U.S. Cl. ................................... 361/42; 307/327; 333/177
[58] Field of Search ............... 323/355, 356; 333/177, 333/178; 307/326, 327; 361/42, 43, 113; 128/901

[56] References Cited

U.S. PATENT DOCUMENTS

| | | | |
|---|---|---|---|
| 1,978,098 | 10/1934 | Alexander et al. | 333/178 |
| 2,321,103 | 6/1943 | Robinson | 361/113 |
| 3,996,537 | 12/1976 | Neuman | 333/177 |

FOREIGN PATENT DOCUMENTS

| | | | |
|---|---|---|---|
| 36641 | 10/1926 | Denmark | 333/177 |
| 896730 | 5/1944 | France | 361/43 |

Primary Examiner—William H. Beha, Jr.
Attorney, Agent, or Firm—Robert Scobey

[57] ABSTRACT

An AC power supply system having transformer and filter structures. The electrical center of the filter section, which is normally connected to system ground, floats with respect to system ground and is connected to a center tap on the secondary winding of the transformer structure.

3 Claims, 1 Drawing Figure

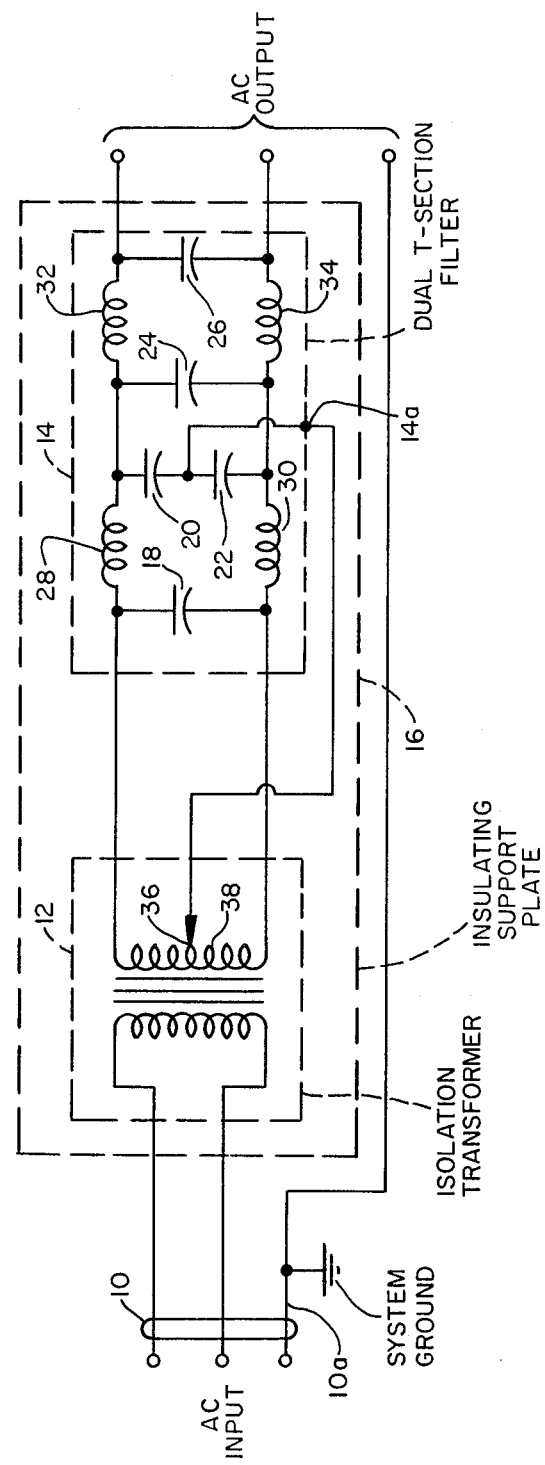

LOW LEAKAGE FILTERED POWER SUPPLY

BACKGROUND AND BRIEF DESCRIPTION OF THE INVENTION

This inventions relates to power supply systems, and more particularly to an AC power supply system exhibiting extremely low ground current leakage, specifically in the order of 5 microamperes or less (at 110 volts).

The present invention is ideally suited for any application where extremely low leakage current as well as highly filtered, transient suppressed AC power is required. A major field of application of this invention is in medical instrumentation, used intraoperatively.

The invention utilizes a conventional twin T filter, available from a number of manufacturers. Such a filter provides highly effective filtering, but is subject to significant leakage to ground when connected in the normal manner, which includes grounding the electrical center of the filter and/or the filter case to system ground.

In the present invention, transformer and filter structures are isolated from ground, and the electrical center of the filter structure is connected to a center tap on the secondary winding of the transformer structure. Isolation from system ground is advantageously achieved by mounting the transformer and filter structures on a non-conductive plate that is electrically isolated from system ground.

By this technique, leakage currents to ground are reduced significantly, and in a typical application involving a 110 volt power supply system, ground leakage current is reduced to one-half that specified under Underwriter Laboratory Standard No. 544 for intraoperative use.

The invention will be more completely understood by reference to the following detailed description, taken in conjunction with the appended drawing which shows a circuit embodying the invention.

Referring to the FIGURE, AC input power is supplied to the system via a line cord 10. The line cord should be one which is generally of low-leakage, in order not to degrade the low-leakage characteristics of the circuit comprising the invention. The AC input to the system normally includes a conductor 10a which is electrically grounded to system ground.

As shown in the FIGURE, an isolation transformer 12 is employed, along with a dual T-section filter 14. Both the transformer and filter are mounted on an insulating support plate 16, so that both are isolated from system ground. The internal circuitry of the filter 14 is conventional, and includes capacitors 18, 20, 22, 24, and 26, as well as inductors 28, 30, 32, and 34. The junction of the capacitors 20 and 22 in the filter 14 constitutes the electrical center of that filter, and that electrical center is normally connected to system ground in a typical application of such a filter. However, by being so connected, significant ground current leakage will be encountered, and such ground current leakage is eliminated by the present invention.

Instead, the electrical center of the filter is isolated from system ground, and is connected to a center tap 36 of secondary winding 38 of transformer structure 12. This connection offers the return path for the filter, a path which is normally supplied to system ground from which it is now disconnected.

The transformer 12 and filter 14 may be housed in conductive housings. In such a case, those conductive housings must be electrically isolated from system ground, and such is the case by use of the insulating support plate 16. The conductive housing of the filter 14 is electrically connected to the center tap 36, as at 14a. Additionally, the core structure of transformer 12, i.e., the laminations, which are often used for mounting purposes, must also be electrically isolated from system ground to reduce leakage; this is accomplished by use of the support plate 16.

For a typical 110 volt AC power application, the transformer 12 may typically be a low leakage double bobbin wound transformer, with its secondary winding center tapped for electrical connection to the electrical center of the filter 14. The filter 14 may be any commerically available twin T filter. As an example, the capacitors in the filter may be 0.1 microfarad, and the coils may be 10 microhenries coils. A transient suppressor, typically a metal oxide varistor, may be employed for transient suppression, connected across the input to the filter 14.

It will be appreciated that modifications may be made to the presently preferred embodiment described above. Accordingly, the invention should be taken to be defined by the following claims.

I claim:

1. In an AC power supply system having a transformer structure that includes primary and secondary windings and a core, and a filter structure including capacitors and inductors, wherein said filter structure has an electrical center which is normally connected to system ground, the improvement for reducing leakage current with respect to system ground comprising a center tap on said secondary transformer winding connected to said electrical center of said filter structure, said transformer and filter structures being electrically isolated from system ground, in which said filter structure includes a conductive housing which is electrically connected to said center tap.

2. A power supply system as in claim 1, in which said transformer structure includes a conductive enclosure which is floating with respect to system ground.

3. A power supply system as in claim 2, in which said transformer and filter structures are mounted on a non-conductive plate which is electrically isolated from system ground.

* * * * *